(12) United States Patent
Luff

(10) Patent No.: US 6,985,541 B1
(45) Date of Patent: Jan. 10, 2006

(54) FM DEMODULATOR FOR A LOW IF RECEIVER

(75) Inventor: Gwilym Luff, Great Shelford (GB)

(73) Assignee: Micor Linear Corporation, San Jose, CA (US)

(*) Notice: Subject to any disclaimer, the term of this patent is extended or adjusted under 35 U.S.C. 154(b) by 880 days.

(21) Appl. No.: 09/721,367

(22) Filed: Nov. 22, 2000

Related U.S. Application Data

(60) Provisional application No. 60/167,196, filed on Nov. 23, 1999.

(51) Int. Cl.
*H01B 5/04* (2006.01)

(52) U.S. Cl. .................................................. 375/324

(58) Field of Classification Search ............... 375/261, 375/326, 350, 316, 224, 216
See application file for complete search history.

(56) References Cited

U.S. PATENT DOCUMENTS

| | | | |
|---|---|---|---|
| 3,988,606 A * | 10/1976 | Eggermont ................. | 235/156 |
| 4,029,904 A | 6/1977 | Papeschi ..................... | 178/88 |
| 4,141,209 A | 2/1979 | Barnett et al. ............... | 58/23 A |
| 4,350,957 A | 9/1982 | Miyamoto ................... | 329/107 |
| 4,397,210 A * | 8/1983 | Finch ......................... | 84/1.03 |
| 4,723,318 A | 2/1988 | Marshall ..................... | 455/109 |
| 4,737,842 A * | 4/1988 | Nagasaki ..................... | 358/27 |
| 4,823,092 A | 4/1989 | Pennock ..................... | 330/253 |
| 4,839,905 A * | 6/1989 | Mantovani ................... | 375/12 |
| 4,873,702 A | 10/1989 | Chiu .......................... | 375/76 |
| 4,918,338 A | 4/1990 | Wong ......................... | 307/521 |
| 5,018,524 A * | 5/1991 | Gu et al. ..................... | 128/421 |
| 5,182,477 A | 1/1993 | Yamasaki et al. ........... | 307/494 |
| 5,222,078 A | 6/1993 | Cason et al. ................. | 375/76 |
| 5,239,273 A * | 8/1993 | Hedstrom et al. ........... | 329/312 |
| 5,245,565 A | 9/1993 | Petersen et al. ............. | 364/825 |
| 5,303,420 A | 4/1994 | Jang ............................ | 455/343 |
| 5,345,190 A | 9/1994 | Kaylor ........................ | 330/258 |
| 5,353,307 A | 10/1994 | Lester et al. ................. | 375/14 |
| 5,432,779 A | 7/1995 | Shimo et al. ................. | 370/30 |
| 5,491,447 A | 2/1996 | Goetschel et al. ........... | 330/254 |
| 5,625,583 A * | 4/1997 | Hyatt .......................... | 365/45 |
| 5,633,896 A * | 5/1997 | Carlin et al. ................. | 375/340 |
| 5,663,989 A | 9/1997 | Fobbester .................... | 375/344 |
| 5,680,072 A | 10/1997 | Vulih et al. .................. | 327/554 |
| 5,734,294 A | 3/1998 | Bezzam et al. .............. | 327/552 |
| 5,825,257 A | 10/1998 | Klymyshyn et al. ........ | 332/100 |

(Continued)

FOREIGN PATENT DOCUMENTS

EP 0 344 852 A1 12/1989

(Continued)

OTHER PUBLICATIONS

U.S. Appl. No. 60/167,196, Cambridge, filed Nov. 1999.*

(Continued)

*Primary Examiner*—Kenneth Vanderpuye
*Assistant Examiner*—Dung X. Nguyen
(74) *Attorney, Agent, or Firm*—Haverstock & Owens LLP

(57) ABSTRACT

A superhet receiver with quadrature IF and improved demodulator is configured to recover a modulated signal from a low IF in a radio receiver. A superhet receiver receives a FM radio-frequency signal, converts the input RF signal to an in-phase IF signal and an IF signal in phase quadrature to the in-phase signal, and outputs the IF signals. A plurality of monostables receive the IF signals and each monostable generates a corresponding output pulse. By combining the monostable output pulses, a complex waveform is generated. The complex waveform includes the demodulated signal and a carrier signal at a significantly higher IF. The complex waveform is filtered to recover the desired modulated signal.

43 Claims, 6 Drawing Sheets

U.S. PATENT DOCUMENTS

| | | | |
|---|---|---|---|
| 5,826,182 A | 10/1998 | Gilbert | 455/326 |
| 5,890,051 A | 3/1999 | Schlang et al. | 455/76 |
| 5,894,496 A | 4/1999 | Jones | 455/126 |
| 5,903,820 A | 5/1999 | Hagstrom | 455/82 |
| 5,920,810 A | 7/1999 | Finol et al. | 455/313 |
| 5,936,474 A | 8/1999 | Rousselin | 331/34 |
| 5,937,335 A | 8/1999 | Park et al. | 455/86 |
| 5,953,640 A | 9/1999 | Meador et al. | |
| 5,960,046 A | 9/1999 | Morris et al. | 375/347 |
| 5,966,666 A | 10/1999 | Yamaguchi et al. | 455/552 |
| 5,999,804 A | 12/1999 | Forgues | 455/333 |
| 6,040,731 A | 3/2000 | Chen et al. | 327/359 |
| 6,060,935 A | 5/2000 | Shulman | 327/345 |
| 6,118,811 A | 9/2000 | Narumi et al. | 375/219 |
| 6,127,884 A | 10/2000 | Rishi | 329/304 |
| 6,175,746 B1 * | 1/2001 | Nakayama et al. | 455/552.1 |
| 6,226,276 B1 | 5/2001 | Na | 370/294 |
| 6,256,511 B1 | 7/2001 | Brown et al. | 455/552 |
| 6,275,101 B1 * | 8/2001 | Underhill | 327/551 |
| 6,308,058 B1 | 10/2001 | Souetinov et al. | 455/326 |
| 6,313,885 B1 * | 11/2001 | Patel et al. | 348/725 |
| 6,343,207 B1 | 1/2002 | Hessel et al. | 455/86 |
| 6,370,205 B1 | 4/2002 | Lindoff et al. | 375/319 |
| 6,480,553 B1 | 11/2002 | Ho et al. | 375/272 |
| 6,484,014 B1 | 11/2002 | Koszarsky | 455/86 |
| 6,516,186 B1 * | 2/2003 | Yamagishi et al. | 455/302 |
| 6,603,818 B1 * | 8/2003 | Dress, Jr. et al. | 375/295 |

FOREIGN PATENT DOCUMENTS

| | | |
|---|---|---|
| EP | 0 576 082 A1 | 12/1993 |
| EP | 0 660 504 A1 | 6/1995 |
| EP | 0 723 335 A1 | 7/1996 |
| EP | 0 833 482 A2 | 4/1998 |
| EP | 0 948 129 A1 | 10/1999 |
| GB | 2330 279 A | 4/1999 |

OTHER PUBLICATIONS

Hidehiko Kuroda et al., "Development of Low-Power Consumption RF/IF Single-Chip Transciever IC for PHS,", pp. 161-167, Compound Semiconductor Device Division, NEC IC Microcomputer Systems, Ltd.

Angel Boveda et al., "GaAs Monolithic Single-Chip Transceiver,", pp. 31-34, IEEE, May 15, 1995.

* cited by examiner

FM DEMODULATOR FOR A LOW IF RECEIVER

RELATED APPLICATIONS

This application claims priority under 35 U.S.C. § 119(e) of the now abandoned U.S. provisional application Ser. No. 60/167,196 filed on Nov. 23, 1999 and entitled "FM DEMODULATOR FOR A LOW IF RECEIVER." The provisional application Ser. No. 60/167,196 filed on Nov. 23, 1999 and entitled "FM DEMODULATOR FOR A LOW IF RECEIVER" is also hereby incorporated by reference.

FIELD OF THE INVENTION

This invention relates to the field of receivers. More particularly, this invention relates to a method of and apparatus for demodulating an FM signal using a low IF receiver.

BACKGROUND OF THE INVENTION

In a superhet receiver, also known as a superheterodyne receiver, an incoming modulated RF (radio-frequency) carrier signal is converted to an IF (intermediate-frequency) carrier value for additional amplification and selectivity prior to demodulation. Often, a superhet receiver is coupled with a pulse count FM (frequency modulation) or FSK (frequency shift keying) demodulator for recovering a desired audio-frequency signal.

Standard techniques for designing a superhet receiver with a pulse count demodulator include the use of hard limiting amplifiers instead of linear IF amplifiers and AGC (automatic gain control) schemes to minimize the design complexity. Such a technique is well known for FM or FSK receivers using a higher IF frequency.

FIG. 1 illustrates a block diagram of a conventional radio IF and demodulator with a moderately low IF and pulse counting demodulator. A modulated RF input is received by an amplifier 10. An output of the amplifier 10 is coupled to a mixer 20. The mixer 20 is coupled to provide its output to an IF filter 40. The modulated RF signal is combined with a local oscillator signal to produce a modulated IF signal as output of the IF filter 40. The IF signal is comprised of a modulated signal, which is the signal the receiver is designed to recover, and the carrier signal. The frequency of the carrier signal is the IF frequency. The combination of the amplifier 10, the mixer 20 and the IF filter 40 is conventionally referred to as a superhet receiver. The IF filter 40 is coupled to an IF limiter 50 via some means of ac coupling. The IF limiter 50 receives the IF signal, removes the amplitude information from the IF signal and outputs a square wave IF signal. The remaining characteristics of the square wave IF signal are the same as the IF signal input into the IF limiter 50.

The frequency modulation is found in the period of the output pulses of the IF limiter 50. This "pulse count demodulator" function is also known as a "frequency to voltage converter." The pulse count demodulator comprises a monostable 60 and a data filter 70. The IF limiter 50 is coupled to the monostable 60. The monostable 60 is triggered once for every cycle at the IF frequency. In other words, the monostable 60 will generate one output pulse for each cycle at the IF frequency. The output of the monostable 60 has a strong component at the carrier signal IF frequency and a weaker component at the modulated signal modulating frequency. The resulting output signal spectrum is dominated by the IF frequency whereby the mean rate pulse of the monostable 60 is the same as the IF frequency.

The output pulses of the monostable 60 are received by the data filter 70. The data filter 70 filters out the IF frequency components and passes the modulation frequency components thereby recovering the desired audio frequency signal. When designing the data filter 70, compromises must be made to take into account the following: the lower the IF frequency the stronger the recovered modulation component but the lower the IF frequency the less the difference between the modulation component and the IF frequency. A realizable data filter needs to remove the IF frequency while passing the modulation frequency.

A known limitation of the technique described in relation to FIG. 1 is that the output of the monostable contains more unwanted energy at the IF frequency than wanted energy at the modulation frequency. In other words, the output from the monostable is dominated by the IF frequency which makes the process of filtering out the IF frequency while passing the modulation frequency much more difficult. For proper filtering to occur, the IF frequency must be at least twice the bit rate of the transmission. For example, with a bit rate of 1 Mbits per second, the IF frequency must be at least 2 MHz. Many applications exist that require the use of a lower IF frequency, often a frequency which is of the same order or lower than the bit rate of transmission.

What is needed is a superhet receiver and demodulator circuit which is capable of recovering FM or FSK modulation from a lower IF frequency, an IF frequency which is often of the same order or lower than the bit rate of transmission.

SUMMARY OF THE INVENTION

A superhet receiver with quadrature IF and improved demodulator is configured to recover a modulated signal from a low IF in a radio receiver. A superhet receiver receives a FM radio-frequency signal, converts the input RF signal to an in-phase IF signal and an IF signal in phase quadrature to the in-phase signal, and outputs the IF signals. A plurality of monostables receive the IF signals and each monostable generates a corresponding output pulse. By combining the monostable output pulses, a complex waveform is generated. The complex waveform includes the modulated signal at the low IF and a carrier signal at a significantly higher IF. The complex waveform is filtered to recover the desired modulated signal.

DETAILED DESCRIPTION OF A PREFERRED EMBODIMENT

Figure 1:
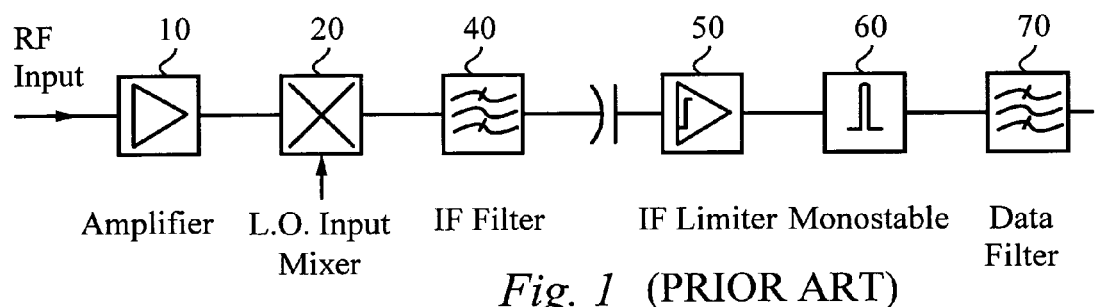
FIG. 1 illustrates a block diagram of a superhet receiver with a pulse count demodulator of the prior art.
Figure 2:
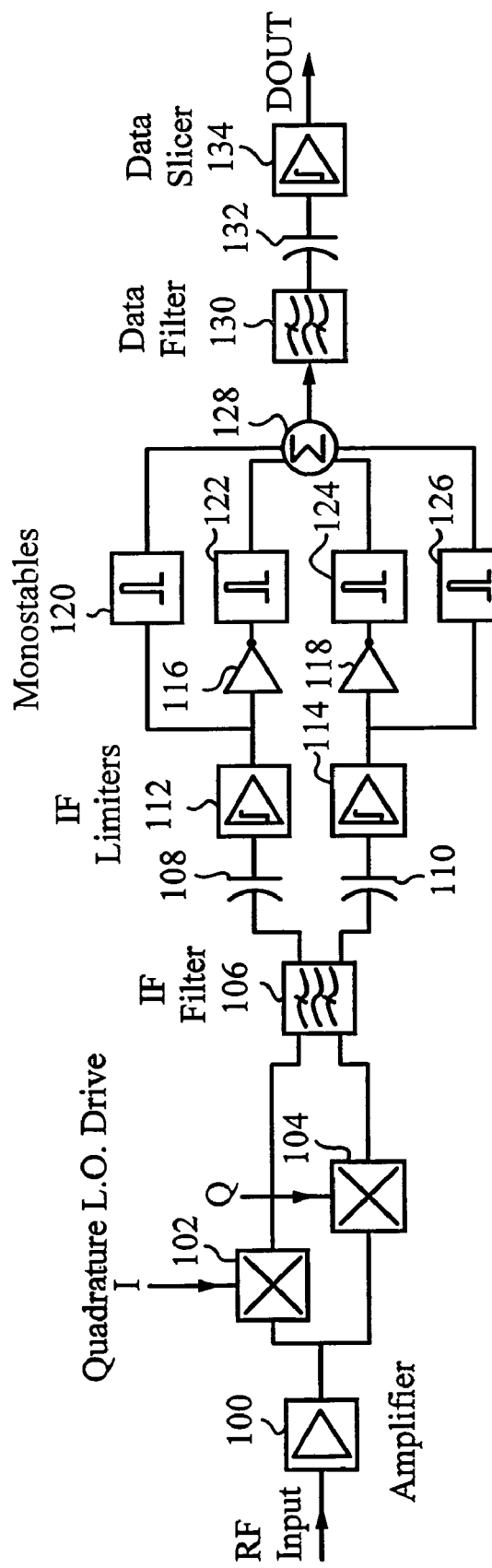
FIG. 2 illustrates a block diagram of the preferred embodiment of the present invention.

A block diagram of a superhet receiver with quadrature IF and improved demodulator of the preferred embodiment of the present invention is illustrated in FIG. 2. An amplifier 100 receives a FM radio frequency (RF) signal. The RF signal has an instantaneous frequency which varies above and below the nominal frequency based on the modulation. The amplifier 100 is coupled to an I-channel mixer 102 and a Q-channel mixer 104. The amplifier 100 increases the RF signal level to overcome noise in the mixers 102 and 104.

The I-channel mixer 102 combines the modulated RF signal from the amplifier 100 with a local RF oscillator signal to produce a modulated intermediate-frequency (IF) signal as output. The difference in frequency between the modulated RF signal and the local RF oscillator frequency is small, preferably in the order of 1 MHz. When the I-channel mixer 102 combines the modulated RF signal and the local RF oscillator signal, two signals are initially generated. The first signal is a sum of the local RF oscillator signal and the modulated RF signal, the sum is approximately two times the modulated RF signal since the frequencies of the local oscillator and modulated signals are nearly equal. This first signal is filtered away immediately. The second signal is a difference between the local RF oscillator signal and the modulated RF signal, which results in a low IF frequency in the order of 1 MHz. The low IF signal is the signal that is output from the I-channel mixer 102.

The Q-channel mixer 104 combines the modulated RF signal from the amplifier 100 with a local phase-shifted RF oscillator signal to produce a phase-shifted IF signal as output. The local phase-shifted RF oscillator signal is in phase quadrature with the local RF oscillator signal. In other words, the two signals are shifted 90 degrees apart. Specifically, the preferred embodiment provides for the local RF oscillator signal to lead the local phase-quadrature RF oscillator signal by 90 degrees. As with the I-channel mixer 102, there are two signals produced when the Q-channel mixer 104 combines the modulated RF signal and the local phase-quadrature RF oscillator signal. The first signal is a sum of the local phase-quadrature RF oscillator signal and the modulated RF signal, which is approximately two times the modulated RF signal since the frequencies of the local phase-quadrature oscillator and the modulated signals are nearly equal. This first signal is filtered away. The second signal is a difference between the local phase-quadrature RF oscillator signal and the modulated RF signal, which results in a low IF frequency in the order of 1 MHz. The second low IF signal is the signal that is output from the Q-channel mixer 104.

The low IF signal output from the I-channel mixer 102 leads the low IF signal output from the Q-channel mixer 104 by 90 degrees. The two low IF signals each have the same IF frequency, but they are phase shifted by 90 degrees. The low IF signal output from the I-channel mixer 102 is also referred to as an I-channel signal and the low IF signal output from the Q-channel mixer 104 is also referred to as a Q-channel signal. Together, the I-channel signal and the Q-channel signal can be referred to as a complex bandpass signal.

The I-channel mixer 102 is coupled to a first input of an IF filter 106, the first input receives the I-channel signal. The Q-channel mixer 104 is coupled to a second input of the IF filter 106, the second input receives the Q-channel signal. The IF filter 106 is a complex bandpass IF filter which is sensitive to both frequency and phase relationships between the input signals. The IF filter 106 is configured to pass signals where the I-channel signal leads the Q-channel signal by 90 degrees. In an alternative embodiment, the Q-channel mixer 104 generates a phase-quadrature signal which leads the in-phase signal from the I-channel mixer 102 by 90 degrees and the IF filter 106 is configured to pass signals where the I-channel signal lags the Q-channel signal by 90 degrees.

Referring to FIG. 2, the output of the IF filter 106 is a phase quadrature pair of signals which are predominately composed of signals with a positive phase sequence. The I-channel mixer 102 and the Q-channel mixer 104 together form an image reject mixer. The image reject mixer plus the IF limiter 106 produce a quadrature output which is used for the demodulation which will be explained below. Alternatively, a broadband phase shifting means can be used to produce the in-phase and quadrature shifted version of the signals, which are the signals to be used for demodulation as explained below. An additional embodiment includes an image reject mixer which produces a negative phase sequence difference between the I-channel signal and the Q-channel signal. In this case, the image reject mixer is coupled to an IF filter which passes through signals where the I-channel signal lags the Q-channel signal by 90 degrees. The preferred embodiment calls for a superhet receiver that outputs one in-phase signal and one phase-shifted signal. However, additional mixers and filters can be added to the superhet receiver to generate additional phase-shifted output signals.

Referring again to FIG. 2, a first output of the IF filter 106 is coupled to an IF limiter 112 via a means of ac coupling 108. The I-channel signal is received by the IF limiter 112. A second output of the IF filter 106 is coupled to an IF limiter 114 via a means of ac coupling 110. The Q-channel signal is received by the IF limiter 114. Both the means of ac coupling 108 and =110 remove any dc components. The IF limiter 112 applies gain and hard limiting action to the I-channel signal whereby the output signal of the IF limiter 112 is a square wave I-channel signal. The rising and falling edges of the square wave correspond to the positive and negative zero crossings of the input I-channel signal to the IF limiter 112. Similarly, the IF limiter 114 applies gain and hard limiting action to the Q-channel signal whereby the output signal of the IF limiter 114 is a square wave Q-channel signal. The rising and falling edges of the square wave correspond to the positive and negative zero crossings of the input Q-channel signal to the IF limiter 114.

The output of each IF limiter 112 and 114 is coupled to a monostable pair. Each monostable pair is comprised of a first monostable coupled in parallel to a serial circuit, the serial circuit includes an inverter and a second monostable. More specifically, a monostable 120 and an inverter 116 are each coupled to the output of IF limiter 112. The inverter 116 is coupled to a monostable 122. An inverter 118 and a monostable 126 are each coupled to the output of the IF limiter 114. The inverter 118 is coupled to a monostable 124. A monostable is a circuit having only one stable condition, to which it returns in a predetermined time interval after being triggered. Every time the monostable is triggered an output pulse is generated, the output pulse having a specified duration and height. In the preferred embodiment, each monostable has a pulse period equal to one-half the nominal IF frequency. Therefore, at the nominal IF frequency, there is a 50% duty cycle on the monostable. As discussed above, the nominal IF frequency is the same for both the I-channel signal and the Q-channel signal. When the IF frequency is higher than nominal, the duty cycle at the monostable output is greater than 50%. When the IF frequency is lower than nominal the duty cycle at the monostable output is less than 50%. Such a configuration produces a monostable output pulse having a duty cycle proportional to the IF frequency. Combining and filtering the four monostable output pulses improves the recovery of the FM modulation. A data filter low pass filters the train of monostable output pulses to give a mean level. This mean level depends on the duty cycle at the monostable output, which in turn depends on the IF frequency.

The monostable 120 receives the I-channel square wave signal from the IF limiter 112. The monostable 120 is triggered by the rising edge of the I-channel signal to output a pulse. The inverter 116 also receives the I-channel square wave signal from the IF limiter 112. The monostable 122 receives an inverted I-channel signal from the inverter 116. In this case, the monostable 122 is triggered by the rising edge of the inverted I-channel signal, which corresponds to the falling edge of the I-channel signal, and outputs a pulse. The output pulse of the monostable 120 leads the output pulse of the monostable 122 by 180 degrees.

The monostable 126 receives the Q-channel square wave signal from the IF limiter 114. The monostable 126 is triggered by the rising edge of the Q-channel signal to output a pulse. The inverter 118 also receives the Q-channel square wave signal from the IF limiter 114. The monostable 124 receives an inverted Q-channel signal from the inverter 118. The monostable 124 is triggered by the rising edge of the inverted Q-channel signal, which corresponds to the falling edge of the Q-channel signal, and outputs a pulse. The output pulse of the monostable 126 leads the output pulse of the monostable 124 by 180 degrees. Since the Q-channel lags the I-channel by 90 degrees, the output of the monostable 120 leads the output of the monostable 126 by 90 degrees and the output of the monostable 120 leads the output of the monostable 124 by 270 degrees. The monostables 120, 126, 122 and 124 are triggered respectively by the rising edge in the I-channel signal, the rising edge in the Q-channel signal, the falling edge in the I-channel signal and the falling edge in the Q-channel signal. Hence, there are four output pulses triggered during one cycle of the IF, each 90 degrees apart.

The four output pulses of the monostables 120, 122, 124 and 126 are coupled to a summing circuit 128. The summing circuit 128 combines the pulses and outputs a signal comprising a demodulated signal at a low frequency, approximately 0 to 0.75 MHz, and the carrier signal which is now at four times the IF frequency. The IF carrier signal received by the monostables is cancelled out by the symmetry of the monostables. In other words, the carrier content has been moved from the IF frequency to four times the IF frequency while the data content of the modulated signal remains unchanged. In the preferred configuration as described above, the present invention improves the ability to filter out data from a carrier signal by a factor of four.

The summing circuit 128 is coupled to a data filter 130. The data filter 130 receives the output signal from the summing circuit 128, filters out the spurious frequencies and passes the recovered modulated signal. The spurious frequencies include the carrier signal at four times the IF frequency and random noise.

The data filter 130 is coupled to a data slicer 134 via means for ac coupling 132. The means for ac coupling 132 removes any dc components. The data slicer 134, also known as a comparator or a center slicer, works in a similar way to the IF limiters. The data slicer 134 receives the output signal from the data filter 130 and produces a logic output where the rising and falling edges of the logic output correspond to the positive and negative zero crossings of the data slicer input. The output of the data slicer 134 is approximately the data content of the original modulated signal. The recovered modulated signal is provided at the output of the data filter 130. There are multiple conventional means for processing this signal. The preferred embodiment utilizes the data slicer 134 but it would be clear to someone skilled in the art that alternative means are available.

Figure 3:
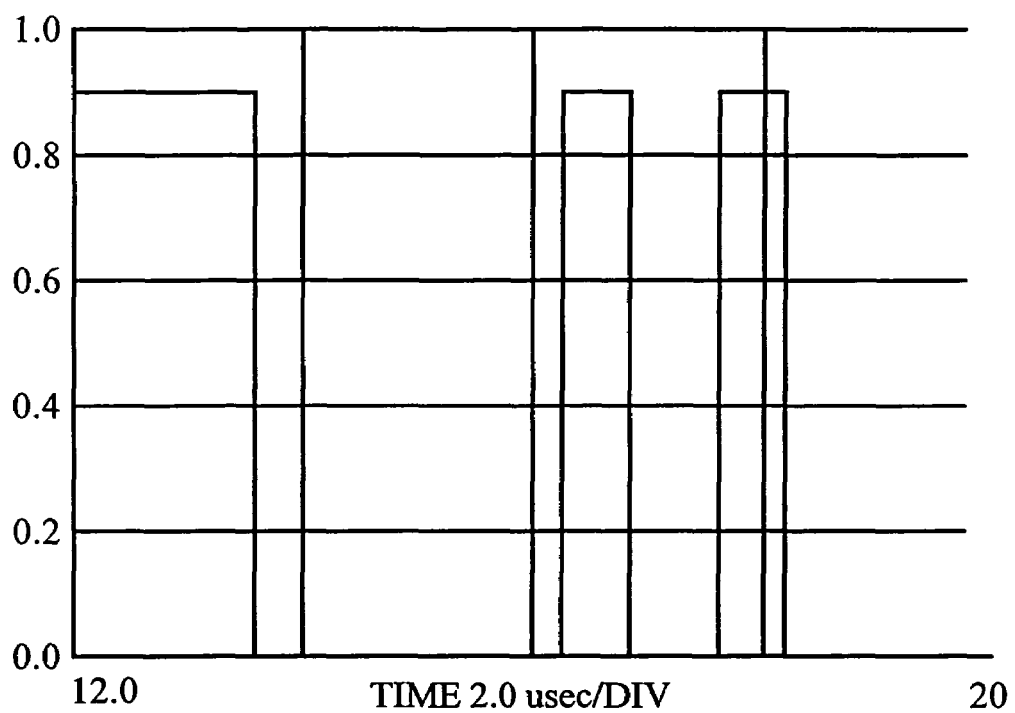
FIG. 3 illustrates an example of digital data to be transmitted via a FM radio-frequency signal and received by the present invention.
Figure 4:
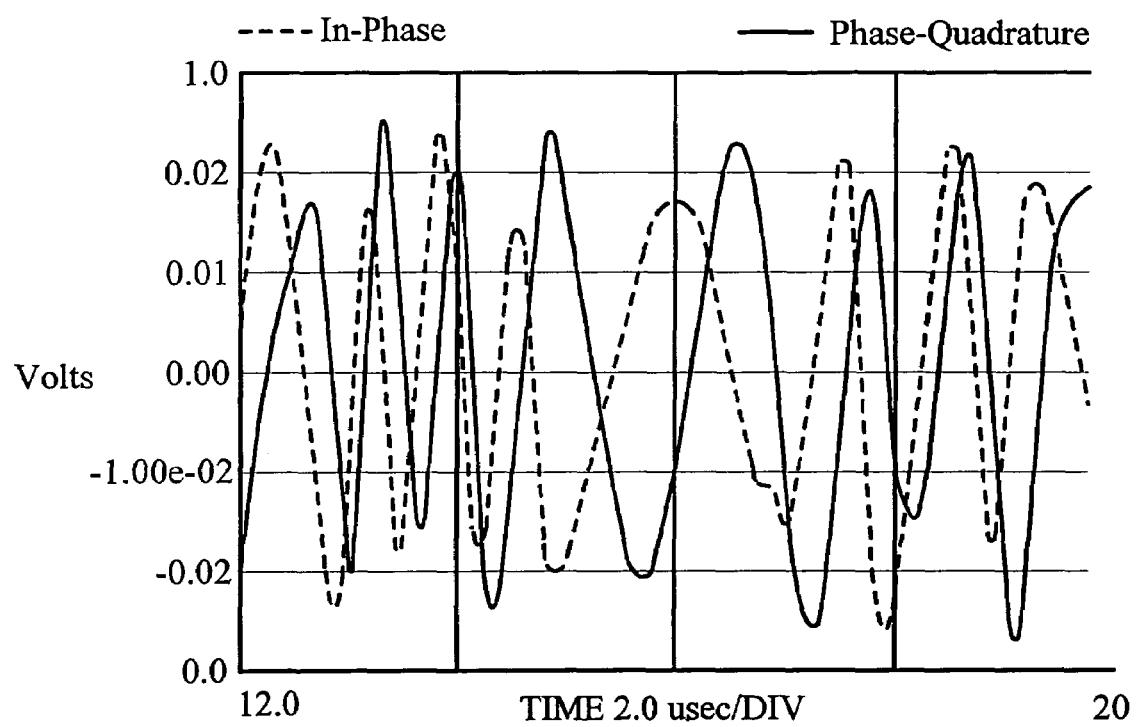
FIG. 4 illustrates the in-phase and quadrature IF filter output signals in response to the input FM radio-frequency signal which carries the digital data illustrated in FIG. 3.
Figure 5:
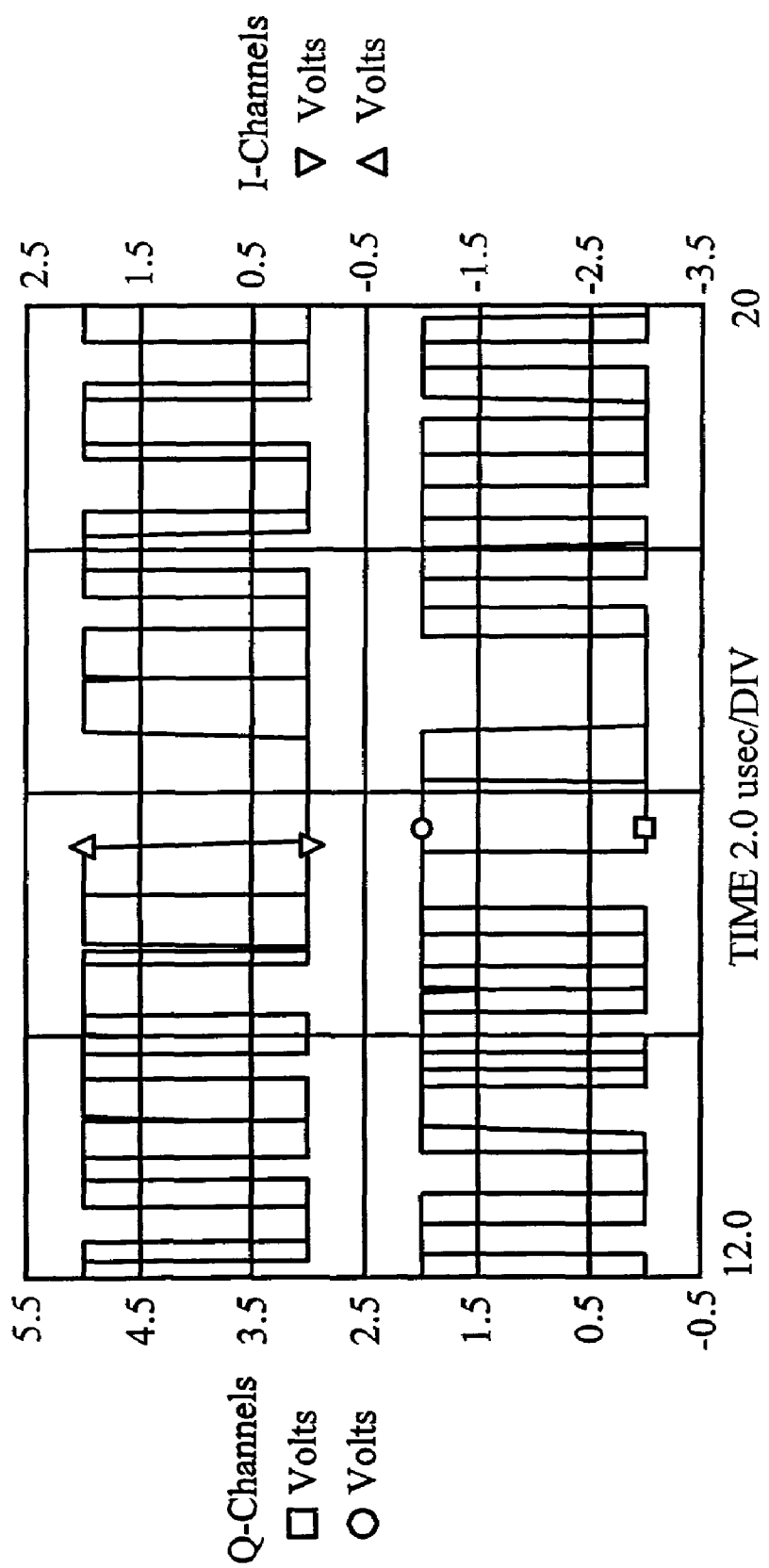
FIG. 5 illustrates the monostable output pulses in response to the in-phase and quadrature IF filter output signals of FIG. 4.
Figure 6:
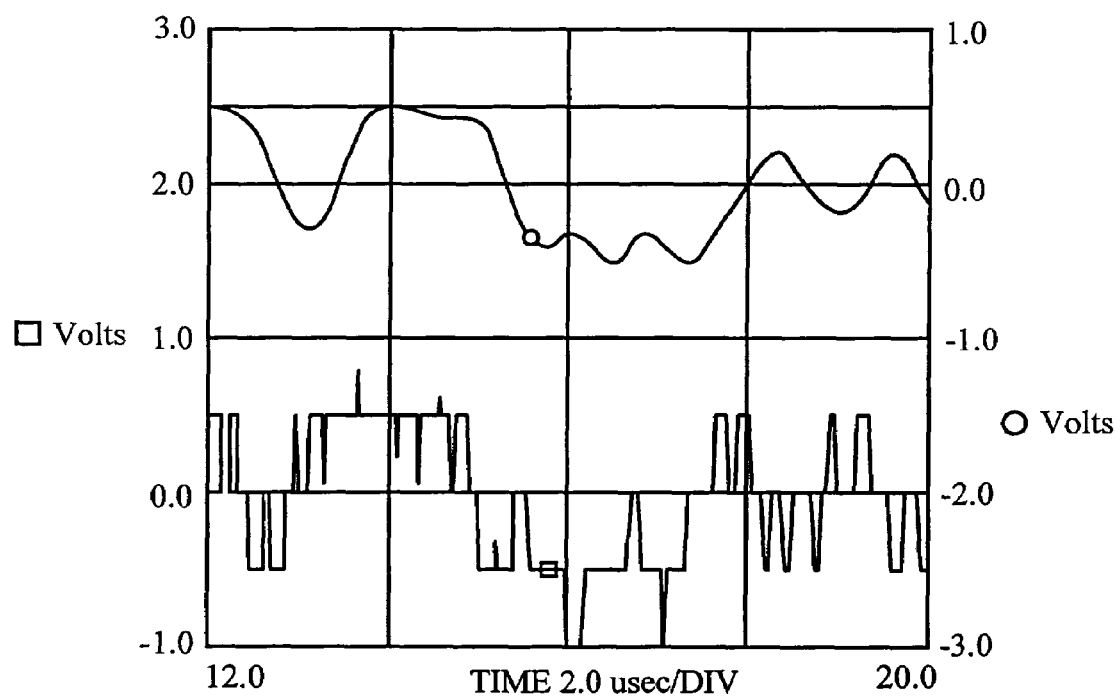
FIG. 6 illustrates the demodulator output in response to the monostable output pulses of FIG. 5.

The plot in FIG. 3 illustrates an example of digital data to be transmitted via a FM radio-frequency signal. This sequence starts with three bits of data '1' followed by four bits of data '0' followed by one bit of data '1' followed by one bit of data '0' followed by one bit of data '1' followed by 2 bits of data '0'. FIGS. 4–6 illustrate resulting waveforms which are taken at different points within the FM demodulator in response to the input FM radio-frequency signal which carries the digital data illustrated in FIG. 3. FIG. 4 shows the I-channel signal and the Q-channel signal as they are output from the IF filter 106. During the data '1' the signals in the IF are at a high frequency. When the nominal IF frequency is 1 MHz, the high frequency in this preferred embodiment is approximately 1.5 MHz. During the data '0' the signals are at a much lower frequency. Once again, with a nominal IF frequency of 1 MHz, the low frequency in this example is approximately 0.5 MHz. FIG. 5 shows the output of all four monostables, the two I-channel monostables on the upper part of the plot and the two Q-channel monostables on the lower part. Comparing FIG. 4 and FIG. 5 shows that there is a monostable output pulse for each zero crossing at the outputs of the IF filter 106. FIG. 6 shows how the demodulator output is produced from the monostable pulses. The lower trace of FIG. 6 shows the analog sum of all the monostable pulses. Although there are many "glitches", the lower trace bears some resemblance to the original modulating data stream. The upper trace of FIG. 6 is the demodulator output after low pass filtering in the data filter 130. The FM demodulation has been successfully recovered, and the original data can be regenerated by center slicing the filter output of data filter 130.

As discussed above, a known limitation of the prior art is that the IF frequency must be at least twice the bit rate of the transmission. In the preferred embodiment of the present invention, the multiple pulses per IF cycle lower the minimum IF frequency required to one-half the bit rate. This allows the present invention to be used with low IF digital FSK receivers where the IF is lower than the bit rate. The preferred embodiment of the present invention utilizes four monostables, thus improving the ability to filter out data from the carrier by a factor of four.

An alternative embodiment includes two monostable configuration which improves the filtering capability by a factor of two. Yet another embodiment utilizes eight monostables which improves the filtering capability by a factor of eight. In this case, the eight monostables are configured into four monostable pairs, each monostable pair receives a corresponding one of the superhet receiver output signals. In order for the superhet receiver to generate the necessary four output signals, as compared to the two output signals of the preferred embodiment, additional mixers and filters can be configured into the receiver to produce two additional phase-shifted output signals. The resulting four output signals are comprised of a first signal, a second signal which lags the first signal by 45 degrees, a third signal which lags the first signal by 90 degrees and a fourth signal which lags the first signal by 135 degrees. The two additional phase-shifted output signals can alternatively be generated by a mathematical means, that is, the use of conventional sum and difference circuitry. The mathematical means can be included within the superhet receiver or coupled externally to the superhet receiver.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation.

What is claimed is:

1. An apparatus for receiving an input signal and outputting a recovered modulated signal, the apparatus comprising:
   a. a superhet receiver for receiving the input signal and for outputting an in-phase signal and one or more phase shifted signals;
   b. a plurality of monostables for receiving the in-phase signal and one or more phase shifted signals, each monostable producing an output pulse;
   c. a summing circuit coupled to each of the monostable output pulses for combining the monostable output pulses into a composite waveform and outputting the composite waveform; and
   d. a filtering circuit for receiving the composite waveform, recovering a modulated signal and outputting the modulated signal.

2. The apparatus as claimed in claim 1 wherein one of the phase shifted signals is in phase quadrature to the in-phase signal.

3. The apparatus as claimed in claim 1 wherein the superhet receiver comprises:
   a. an image reject mixer for converting the input signal into an in-phase intermediate-frequency (IF) signal and a phase-shifted IF signal; and
   b. an IF filter coupled to the image reject mixer for outputting the in-phase and phase-shifted IF signals.

4. The apparatus as claimed in claim 3 wherein the monostables are configured into monostable pairs such that the number of monostable pairs is equal to the number of output signals from the superhet receiver.

5. The apparatus as claimed in claim 4 wherein the monostable pair comprises:
   a. a first monostable; and
   b. a serial circuit coupled in parallel to the first monostable, the serial circuit includes an inverter and a second monostable wherein the output of the inverter is coupled to the input of the second monostable.

6. The apparatus as claimed in claim 5 wherein the monostable pair receives a corresponding one of the superhet receiver output signals.

7. The apparatus as claimed in claim 6 wherein the output pulse of the first monostable of the monostable pair is triggered by a rising edge of the corresponding one of the superhet receiver output signals and the output pulse of the second monostable of the monostable pair is triggered by the falling edge of the corresponding one of the superhet receiver output signals.

8. The apparatus as claimed in claim 7 wherein the output of the superhet receiver comprises an in-phase signal and a signal in phase-quadrature to the in-phase signal.

9. The apparatus as claimed in claim 8 wherein a first monostable pair receives the in-phase signal and a second monostable pair receives the signal in phase-quadrature.

10. The apparatus as claimed in claim 9 wherein the input signal to the superhet receiver is a radio-frequency signal and the output signals from the superhet receiver are intermediate-frequency signals.

11. The apparatus as claimed in claim 10 wherein the output composite waveform from the summing circuit comprises one pulse, multiplied by the number of monostables, for each cycle of the in-phase intermediate-frequency signal.

12. The apparatus as claimed in claim 11 wherein the output pulse of the monostable includes a pulse period, the pulse period is equal to one-half the nominal IF period.

13. A method of demodulating an FM signal using a superhet receiver and a demodulator, the method comprising the steps of:
   a. applying an input signal to a superhet receiver for generating an in-phase signal and one or more phase shifted signals;
   b. providing the in-phase signal and the one or more phase shifted signals to a plurality of monostables for generating a plurality of generated output pulses;
   c. summing the plurality of generated output pulses from each of the plurality of monostables in a summing circuit for forming a composite waveform; and
   d. filtering the composite waveform from the summing circuit in a filtering circuit for outputting a modulated signal therefrom.

14. The method as claimed in claim 13 wherein one of the phase shifted signals is in phase quadrature to the in-phase signal.

15. The method as claimed in claim 14 wherein the input signal to the superhet receiver is a radio-frequency signal and the output signals from the superhet receiver are intermediate-frequency signals.

16. The method as claimed in claim 15 wherein the output composite waveform from the summing circuit comprises one pulse, multiplied by the number of monostables, for each cycle of the in-phase intermediate-frequency signal.

17. An apparatus for receiving an input signal and outputting a recovered modulated signal, the apparatus comprising:
   a. means for applying an input signal to a superhet receiver for generating an in-phase signal and one or more phase shifted signals;
   b. means for providing the in-phase signal and the one or more phase shifted signals to a plurality of monostables for generating a plurality of generated output pulses;
   c. means for summing the plurality of generated output pulses from each of the plurality of monostables in a summing circuit for forming a composite waveform;
   d. means for filtering the composite waveform from the summing circuit in a filtering circuit for outputting a modulated signal therefrom.

18. The apparatus as claimed in claim 17 wherein one of the phase shifted signals is in phase quadrature to the in-phase signal.

19. The apparatus as claimed in claim 18 wherein the superhet receiver comprises:
   a. an image reject mixer for converting the input signal into an in-phase intermediate-frequency (IF) signal and a phase-shifted IF signal; and b. an IF filter coupled to the image reject mixer for outputting the in-phase and phase-shifted IF signals.

20. The apparatus as claimed in claim 19 wherein the monostables are configured into pairs such that the number of monostable pairs is equal to the number of output signals from the superhet receiver.

21. The apparatus as claimed in claim 20 wherein the monostable pair comprises:
   a. a first monostable; and
   b. a serial circuit coupled in parallel to the first monostable, the serial circuit includes an inverter and a second monostable wherein the output of the inverter is coupled to the input of the second monostable.

22. The apparatus as claimed in claim 21 wherein the monostable pair receives a corresponding one of the superhet receiver output signals.

23. The apparatus as claimed in claim 22 wherein the output pulse of the first monostable of the monostable pair is triggered by a rising edge of the corresponding one of the superhet receiver output signals and the output pulse of the second monostable of the monostable pair is triggered by the falling edge of the corresponding one of the superhet receiver output signals.

24. The apparatus as claimed in claim 23 wherein the output of the superhet receiver comprises an in-phase signal and a signal in phase-quadrature to the in-phase signal.

25. The apparatus as claimed in claim 24 wherein a first monostable pair receives the in-phase signal and a second monostable pair receives the signal in phase-quadrature.

26. The apparatus as claimed in claim 25 wherein the input signal to the superhet receiver is a radio-frequency signal and the output signals from the superhet receiver are intermediate-frequency signals.

27. The apparatus as claimed in claim 26 wherein the output composite waveform from the summing circuit comprises one pulse, multiplied by the number of monostables, for each cycle of the in-phase intermediate-frequency signal.

28. The apparatus as claimed in claim 27 wherein the output pulse of the monostable includes a pulse period, the pulse period is equal to one-half the nominal IF period.

29. An apparatus for receiving an input signal and outputting a recovered modulated signal, the apparatus comprising:
   a. a superhet receiver for receiving the input signal and for outputting an in-phase signal and one or more phase shifted signals;
   b. a plurality of monostables for receiving the superhet receiver output signals, the monostables configured into pairs whereby the number of monostable pairs is equal to the number of output signals from the superhet receiver, and each monostable producing an output pulse;
   c. a summing circuit coupled to each of the monostable output pulses for combining the monostable output pulses into a composite waveform and outputting the composite waveform; and
   d. a filtering circuit for receiving the composite waveform, recovering a modulated signal and outputting the modulated signal.

30. The apparatus as claimed in claim 29 wherein the superhet receiver comprises:
   a. an image reject mixer for converting the input signal into an in-phase intermediate-frequency (IF) signal and a phase-shifted IF signal; and
   b. an IF filter coupled to the image reject mixer for outputting the in-phase and phase-shifted IF signals.

31. The apparatus as claimed in claim 30 wherein the monostable pair comprises:
   a. a first monostable; and
   b. a serial circuit coupled in parallel to the first monostable, the serial circuit includes an inverter and a second monostable wherein the output of the inverter is coupled to the input of the second monostable.

32. The apparatus as claimed in claim 31 wherein the monostable pair receives a corresponding one of the superhet receiver output signals.

33. The receiver as claimed in claim 32 wherein the output pulse of the first monostable of the monostable pair is triggered by a rising edge of the corresponding one of the superhet receiver output signals and the output pulse of the second monostable of the monostable pair is triggered by the falling edge of the corresponding one of the superhet receiver output signals.

34. The apparatus as claimed in claim 33 wherein the output of the superhet receiver comprises the in-phase signal and a signal in phase-quadrature to the in-phase signal.

35. The apparatus as claimed in claim 34 wherein a first monostable pair receives the in-phase signal and a second monostable pair receives the signal in phase-quadrature.

36. The apparatus as claimed in claim 35 wherein the input signal to the superhet receiver is a radio-frequency signal and the output signals from the superhet receiver are intermediate-frequency signals.

37. The apparatus as claimed in claim 36 wherein the output composite waveform from the summing circuit comprises one pulse, multiplied by the number of monostables, for each cycle of the in-phase intermediate-frequency signal.

38. The apparatus as claimed in claim 37 wherein the output pulse of the monostable has a pulse period equal to one-half the nominal IF period.

39. An apparatus for receiving an input signal and outputting a recovered modulated signal, the apparatus comprising:
   a. a superhet receiver for receiving an input signal and for outputting an in-phase signal and a signal in phase-quadrature to the in-phase signal;
   b. a plurality of monostables for receiving the in-phase signal and the signal in phase-quadrature, the monostables configured into pairs wherein a first monostable pair receives the in-phase signal and a second monostable pair receives the signal in phase-quadrature, and further wherein each monostable produces an output pulse;
   c. a summing circuit coupled to each of the monostable output pulses for combining the monostable output pulses into a composite waveform and outputting the composite waveform; and
   d. a filtering circuit for receiving the composite waveform, recovering a modulated signal and outputting the modulated signal.

40. The apparatus as claimed in claim 39 wherein the number of monostable pairs is equal to the number of superhet receiver output signals.

41. The apparatus as claimed in claim 40 wherein the monostable pair comprises:
   a. a first monostable; and
   b. a serial circuit coupled in parallel to the first monostable, the serial circuit includes an inverter and a second monostable wherein the output of the inverter is coupled to the input of the second monostable.

42. The apparatus as claimed in claim 41 wherein the output composite waveform from the summing circuit comprises one pulse, multiplied by the number of monostables, for each cycle of the in-phase intermediate-frequency signal.

43. A method of demodulating an FM signal using a superhet receiver and a demodulator, the method comprising the steps of:
   a. applying an input signal to the superhet receiver for generating an in-phase signal and a signal in phase-quadrature to the in-phase signal;
   b. providing the in-phase signal and the signal in phase-quadrature to a plurality of monostables, the monostables configured into pairs wherein a first monostable pair receives the in-phase signal and a second monostable pair receives the signal in phase-quadrature, and further wherein each monostable produces an output pulse;
   c. summing the plurality of generated output pulses from each of the plurality of monostables in a summing circuit for forming a composite waveform; and
   d. filtering the composite waveform from the summing circuit in a filtering circuit for outputting a modulated signal therefrom.

* * * * *

UNITED STATES PATENT AND TRADEMARK OFFICE
CERTIFICATE OF CORRECTION

| | |
|---|---|
| PATENT NO. | : 6,985,541 B1 |
| APPLICATION NO. | : 09/721367 |
| DATED | : January 10, 2006 |
| INVENTOR(S) | : Gwilym Luff |

It is certified that error appears in the above-identified patent and that said Letters Patent is hereby corrected as shown below:

On title page
IN THE ASSIGNEE [ITEM 73]

Delete "Micor Linear Corporation" and insert --Micro Linear Corporation--.

IN THE REFERENCES CITED - OTHER PUBLICATIONS - p. 1

Delete "U.S. Appl. No. 60/167,196, Cambridge, filed Nov. 1999."

IN THE REFERENCES CITED - OTHER PUBLICATIONS - p. 2

Add --Doc. No. XP-000538492-- between "Transceiver,"" and ",pp. 31-34"

Signed and Sealed this

Eighteenth Day of September, 2007

JON W. DUDAS
*Director of the United States Patent and Trademark Office*